(12) United States Patent
James

(10) Patent No.: US 9,947,884 B1
(45) Date of Patent: Apr. 17, 2018

(54) SOLAR ACTIVE POWDER FOR FUSION POWDER COATING

(71) Applicant: Pison Stream Solutions, LLC, Brentwood, TN (US)

(72) Inventor: Joseph H. James, Brentwood, TN (US)

(73) Assignee: PISON STREAM SOLUTIONS, LLC, Brentwood, TN (US)

( * ) Notice: Subject to any disclaimer, the term of this patent is extended or adjusted under 35 U.S.C. 154(b) by 256 days.

(21) Appl. No.: 14/230,343

(22) Filed: Mar. 31, 2014

Related U.S. Application Data

(60) Provisional application No. 61/814,522, filed on Apr. 22, 2013.

(51) Int. Cl.
- *H01L 31/00* (2006.01)
- *H01L 51/44* (2006.01)
- *H01B 1/12* (2006.01)

(52) U.S. Cl.
CPC ............. *H01L 51/44* (2013.01); *H01B 1/124* (2013.01)

(58) Field of Classification Search
CPC ............ H01G 9/00; H01L 51/00; H01L 31/00
USPC .................................................. 136/243–265
See application file for complete search history.

(56) References Cited

U.S. PATENT DOCUMENTS

| | | | | |
|---|---|---|---|---|
| 4,672,149 A | * | 6/1987 | Yoshikawa | ............... H01B 3/30 136/263 |
| 6,191,353 B1 | * | 2/2001 | Shiotsuka | ............... B32B 17/04 136/256 |
| 2008/0245410 A1 | * | 10/2008 | Duerr | ................... H01G 9/2022 136/256 |

OTHER PUBLICATIONS http://www.engineeringtoolbox.com/thermal-conductivity-plastics-d_1786.html.*

* cited by examiner

*Primary Examiner* — Niki Bakhtiari
(74) *Attorney, Agent, or Firm* — McDonald Hopkins LLC

(57) ABSTRACT

A fusion coating powder useful in forming a coating by fusion of the powder comprising a solar active or a photo-voltaic pigment in combination with a resin including a conductive resin and a device for generating electric energy from solar or photo illumination comprising an electrode, a first powder coated layer of an absorptive pigment and a resin, a second powder coated layer of the aforementioned solar active powder, and a protective layer.

17 Claims, No Drawings

SOLAR ACTIVE POWDER FOR FUSION POWDER COATING

CROSS-REFERENCE TO RELATED APPLICATION

This application claims the benefit of U.S. Provisional Application 61/814,522 filed Apr. 22, 2013.

BACKGROUND

A fusion coating process is a process in which a coating powder is distributed over a substrate and heated. The heated powder fuses to form a continuous film. The substrate may be heated or unheated when the powder is applied. Heat supplied to the substrate from an external source, such as an oven, causes the powder to fuse into a continuous film. Know fusion coatings processes for application of powder coating compositions to a substrate include electrostatic spraying, fluidized bed coating and hot flocking.

SUMMARY

One manifestation of the disclosure is a powder coating composition that is useful for energy absorption to convert natural energy into electricity via direct light. This composition can be applied electrostatically to various substrates types such as wood, plastic, metal, concrete, aluminum to form a solid over the various substrates types. This technology can be used as a direct replacement for the solar glass panel technology.

In one embodiment of the invention, a powder suitable for fusion powder coating as disclosed herein includes a solar active or photovoltaic pigment in a conductive resin matrix. The powder is made by blending the pigment with the resin, curing the resin (e.g., after extrusion) and grinding the cured resin layer into a powder. In one embodiment, the pigment is blended with the resin in an extruder.

In one embodiment, the disclosure provides a laminate that is made up of three powder coated layers. One layer is applied to and carried on a conductive substrate which functions as an electron collector or electrode. This layer may contain a light-absorptive or reflective pigment that directs light energy that is incident the laminate to the photovoltaic or solar active pigments that are contained in a second layer that is positioned on the light incident side of the absorptive a reflective pigment layer. The photovoltaic/solar active layer is overcoated with a surface layer that functions as a protective coating. In one embodiment, the photovoltaic or solar-active pigment may be nanodots. In summary, this platform utilizes absorption pigments and photoactive materials and, in one embodiment, organic dye photoactive materials, to convert incident actinic photo or solar energy. One embodiment utilizes about 30-45% total pigment loading.

Photoactive Layer

Coatings developed in accordance with this disclosure for making the photoactive layer may convert the energy of a light source (e.g., daylight D65/CWF/direct sun light, etc.) into electricity by utilizing photo or solar active chemical additives that are blended or embedded (e.g., using a master batch) into a powder coating resin matrix that is conductive. In one embodiment the resin matrix for the photoactive layer includes a resin having a glass transition temperature greater than about 60° C., more particularly greater than about 62° C. with (DSC), a hydroxyl (OH) number of about 40-45 and a hydroxyl equivalent weight (nominal), of about 1200 to 1400 and, more particularly, about 1247-1403; a hydroxylated polyester resin, such as Rucote 118 from Bayer Science Materials, or SP100 or SP400 from Sun Polymers International that is typified by a hydroxyl number of 42+/−10 (mg KOH/g), and a melt viscosity specification of 8500 (at 200° C.), or a combination thereof. In one embodiment the two resins may be blended at a ratio of about 70/30 (first resin to second resin). This produces a more homogenous mix when introduced to the additional fillers and additives when mixed and extruded.

The resin system used in the photoactive layer also contains a conductive resin, such as a conjugated resin, in order to electrically conduct the electrons generated upon exposure of the photoactive pigment to the underlying layer and the electrode. Examples of conjugated polymers include phenolic resins, such as DER 663U from Dow Chemical, GT76013 from Huntsman Master Batch, as well as resins including a conductive pigment such as Cabot 800 Black Pigment or Ferro FE6331, a conductive black pigment. A polymethyl methacrylate polymer may also be used as a conductive resin, such as AG500 from Sun Polymer. Other examples of conductive resins include poly(2-methoxy-5-(3'7'-dimethyloctyloxy)-1,4-phenylene vinylene from Sigma-Aldrich which is a light emitting conjugated polymer of the rigid rod family, poly(3-hexylthiophene-2,5-diyl) electronic grade 99.995% trace metals from Sigma-Aldrich, and zinc phthalocyanine (ZnPc) with 90% zinc from Sigma-Aldrich. In one embodiment, the conductive polymer may be used in an amount of about 3 to 8% by weight and the non-conductive resin may be used in an amount of about 5 to 8% by weight. In one embodiment, platform binder systems for the photoactive layer contains constituents such as nano particle titanium dioxide, strontium based phosphors, solar nano dots, and photovoltaic materials that are incorporated within the platform binder system as photoactive pigments.

In one embodiment, the additives and fillers discussed herein are incorporated into the resin and then extruded into a layer that is cured, and the layer is ground to form a solid resin flake, pigment or fusion powder. The powder may have an average particle size of about 25 to 35 micron in one embodiment.

In one embodiment, the solar active or photovoltaic or photoactive layer may have the composition shown in Table 1 below. The photoactive or solar active layer is responsible for collecting and generating photo generated charged carriers which are transported to collect at opposite electrodes. The photoactive pigments can extract energy from the Sun and other lighting resources such as standard Daylight (D65), Cool White Fluorescent lighting (CWF) with minimum time required.

TABLE 1

| Example: Solar Active Layer | |
|---|---|
| Powder Coating Resin | 55.8% |
| Absorption Pigments | 3.5% |
| Organic conjugated Solar Active Material | 4.0% |
| Titanium Dioxide | 15.0% |
| Polymeric Isocyanurate Curative | 21.7% |
| Total | 100% |

*SP 033 Sun Chemicals

In one embodiment, the photo or solar active pigments that are suitable for use in photovoltaic cells are incorporated into the resin for the photoactive layer alone or in combination with strong absorbers (as illustrated in Table 1 above) such as the absorbers disclosed for incorporation into the absorptive base layer disclosed below. In one embodiment, the photoactive pigment is incorporated into a platform binder resin system additionally containing flow additives and curatives and absorption type pigmentation in an extruder. The extruded layer is cured and ground to provide a powder coating material for forming the photoactive layer. The powder coating can be sprayed on a support, namely the absorptive layer, and heated 15 min. at 375° F. to form the photoactive coating. In one embodiment, the photoactive layer is about 2.5 to 5.0 mils thick in one embodiment of the invention.

Examples of photovoltaic or photoactive materials useful herein include (Si) silicone, (GaAs) gallium-arsenide, (CdTe) cadmium-telluride, (CIS) cadium-indium-selenide, amorphous silicon, polycrystalline silicone Silicon base powder material increases the conductivity and acts as a barrier to hold the energy. In one embodiment, the photoactive pigment is obtained by coating a photoactive dye on a semiconductor carrier. One advantageous solar active material prepared by coating magnesium phthalocyanine on glass flakes such as GF 200 grade. In one embodiment, the photoactive material is a SEMIC (semiconductor) based material crushed into powder form less than 9.0 microns and then blended using a master batch into Ruco118 resin. The same process may be followed for other photoactive materials at very low resin to powder ratios, e.g., 98/2 ratio.

Examples of solar active materials include strontium based phosphors such as strontium aluminate pigments. These pigments may be produced with a photoluminescent layer having a fluorescence of 300 to 800 nm on 0.687 mm white-based polyester urethane base. Strontium aluminates base phosphors are used in one embodiment and have exciting wavelengths of 300 to 450 nm.

The photo responsive fillers can also be introduced in the form of nanodots. Examples of solar nanodots useful in the invention are nanocrystal semic (semiconductors) with indium tin oxide and an organic solar active material. In one embodiment, the nanodots have a particle size of about 1.0 to 2.0 microns and in one embodiment are blended into a conductive resin blend having a melt viscosity of about 8500 (at 200°) containing a curative such as TGIC in order to obtain solar selective absorption coatings. The photoactive pigment may be incorporated into the conductive resin blend in an amount of about 0.1 to 0.5% in one embodiment. In one embodiment, a solar nanodot pigment useful in one embodiment is made by master batching conductive pigments into a polyurethane resin including $TiO_2$ and $SiO_2$ and creating sub droplets having an particle size less than about 2 µm. In one embodiment, the solar active material is present in the solar active layer in an amount of up to about 4% by wt. and more typically about 2.5 to 4.5% by weight.

Absorptive Layer

The absorption of light is required to activate the photoactive pigment or nanodots in the photoactive layer. The light source can be and actinic source such as direct light such as sunlight/Daylight D65 or conventional generated light such as CWF or Fluorescent.

The layer containing the absorptive pigments and the protective coating layer can be made using powder coating compositions that may be made using various resins known to the powder fusion coating art including polyurethanes, triglycidylisocyanaturate (TGIC) resins, primid resin systems, epoxy resins, hybrid polyester and epoxy resin combinations (e.g., epoxy, epoxy-polyester) urethane-polyester, TGIC-free polyester which are free of TGIC and acrylic coating materials. Other constituents include curatives, flow aids, degassing agents, catalysts, pigments, modifiers, fillers and charge inhibitors, photoelectric cells, cadium nanocrystals (cd), nano-carbon type pigments and conjugated polymers.

Examples of absorption pigmentations include V-9415 Yellow, V-9248 Blue, 10202 Black Pigments from Ferro and Ellipse Titanium Dioxide Pigment, Monarch 800 Carbon Black from Cabot Industries, strontium aluminate pigments and nano-carbon pigments. The function of these pigments is to reflect light to the solar active pigments where the light produces an electric voltage in the electrode. The absorptive pigment is incorporated into the base layer in one embodiment in an amount of about 3 to 4.5%. However, larger amounts can be used but add to the expense of the device. Titanium dioxide is a particularly desirable absorptive filler. In one embodiment it is used in an amount up to about 16 wt. % in the absorptive layer.

In one embodiment the absorptive layer is a white nanoporous $TiO_2$ base powder coating at 1-2 mils thick for absorption of incident light. Increasing absorptive layer thickness, ultimately results in increased light absorption and energy retainment in the photoactive layer. An example of an absorptive pigment layer is provided in Table 2 below:

TABLE 2

| Absorptive layer Titanium White Base | | | |
|---|---|---:|---:|
| Ruco 118 * | Polyester Resin | 331 g | 46.0% |
| AG300 | Acrylic Resin | 131 g | 18.3% |
| NI2 | Polymeric Isocyanate curative | 90.09 g | 12.6% |
| MOD 6000 | Flow aid | 10.16 g | 1.42% |
| 104S | De-gassing agent | 8.04 g | 1.12% |
| RCL 960 | Titanium dioxide | 150.0 g | 20.56% |
| Total | | | 100% |

* Rucote 118 — Bayer Science Materials,
AG300 — Sun Polymer International,
NI 2- Bayer DuPont Science Materials,
MOD 6000 — Cytec Industries,
104S- Air Products,
RCL-960 Titanium- DuPont Protective Layer In one embodiment, the top or protective layer has the composition shown in Table 3. Those skilled in the art will recognize that the protective function of this layer can be obtained with other compositions provided that the protective layer is compatible with the underlying solar active layer such that it adheres to it without substantially diminishing the light transmitted to the solar active layer.

TABLE 3

| Protective Layer* | | | | |
|---|---|---:|---:|---:|
| Ruco 106 | Polyester Resin | 462 g | 81.0% | 1 |
| NI2 | Polymeric Isocyanate | 90.09 g | 15.8% | 2 |
| Mod 6000 | Flow aid | 10.16 g | 1.78% | 3 |
| 104S | De-gassing Agent | 8.04 g | 1.41% | 4 |
| Total | | 570.29 g | 100% | |

*Rucote 106 — Bayer Science Materials,
AG300 — Sun Polymer International,
NI 2- Bayer Science Materials,
MOD 6000 — Cytec Industries,
104S- Air Products,
RCL-960 Titanium- DuPont This platform includes pigments that are blended, e.g., using a master batch, with other constituents such as resins, curatives and flow aids. The component constituents comprising the admixture are extruded to distribute the constituents to form an extrusion product. Any suitable extruder may be utilize a singe or twin screw mechanism. In one embodiment, the blended constituents are placed in the extruder hopper and fed via the screw mechanism to the extruder die, preferable with three to four temperature zones. The zone settings may be respectively 60/60/80/140° F. The blended constituents are extruded at about 300 rpm and at a feed rate of about 400 g/min. to form an extrusion product. The flow aid facilitates blending of constituents in the extrusion product. The extrusion products are fed through chill rolls and cured in an oven subsequently for about 15 mins at about 375° F.

The photoactive layer is coated with the protective overcoat which may be a clear coating designed to protect the coatings outdoors. The protective layer must be an outdoor resistance layer such as polyurethane or acrylic base TGIC combination. In one embodiment, the protective layer is about 2.0 to 4.0 mils in thickness and cured at 15 min at 375° F. It protects the underlying layers from ambient air to prevent degradation of the active layer and electrode materials by the effect of water and oxygen making the photoactive layer photochemically stable and preserving the active layer.

Quantitative results illustrates this proprietary technique allows us to utilize this eco-friendly solution to preserve energy up to 24 hours which will dramatically reduce energy costs. The technology as a powder coating can be applied on various substrate types such as plastic, metal, aluminum, wood, concrete, paper, cloth, stucco and a host of other materials to act as a base to generate electricity, examples being architecture buildings, automobiles, mobile phones, or anything which requires power usage to operate.

What is claimed:

1. A fusion coating powder composition comprising a photoactive material including phthalocyanine and a conductive resin, wherein the fusion coating powder composition produces electricity upon exposure to light when the powder is heated to form a fused, continuous film.

2. The fusion coating powder composition of claim 1 wherein the fusion coating powder composition is formed by blending the photoactive material and the conductive resin, extruding the blend and grinding the extruded blend to form the fusion coating powder composition.

3. The fusion coating powder composition of claim 1 wherein the photoactive material includes a strontium phosphor.

4. The fusion coating powder composition of claim 1 wherein the conductive resin has a glass transition temperature (Tg) greater than about 60° C. with differential scanning calorimetry (DSC).

5. The fusion coating powder composition of claim 1 wherein the conductive resin has a hydroxyl number between 40 to 45 and a hydroxyl equivalent weight between 1200 and 1403.

6. The fusion coating powder composition of claim 1 wherein the conductive resin is a phenolic or a conjugated polymer, a polymer containing a conductive pigment, an acrylate resin, or combinations thereof.

7. The fusion coating powder composition of claim 1 wherein the photoactive material includes a solar nano dot.

8. The fusion coating powder composition of claim 1 wherein the fusion coating powder composition further comprises an adsorptive pigment.

9. The fusion coating powder composition of claim 8 wherein the adsorptive pigment is titanium dioxide.

10. The fusion coating powder composition of claim 1 wherein the photoactive material includes a semiconductor.

11. The fusion coating powder composition of claim 9 wherein the semiconductor is gallium-arsenide.

12. The fusion coating powder composition of claim 1 wherein the fusion coating powder composition has the following composition:

| | |
|---|---|
| The conductive resin | 55.8 wt. % |
| Absorptive pigments | 3.5 wt. % |
| The photoactive material | 4.0 wt. % |
| Titanium dioxide | 15.0 wt. % |
| A polymeric isocyanurate curative | 21.7 wt. %. |

13. The fusion coating powder composition of claim 1 wherein the fusion coating powder composition has an average particle size between 25 and 35 micrometers.

14. The fusion coating powder composition of claim 1 wherein the phthalocyanine is magnesium phthalocyanine coated onto glass flakes.

15. A fused, continuous film comprising a plurality of layers wherein a first layer comprises the fusion coating powder composition of claim 1 with a protective layer positioned adjacent to the first layer.

16. A fused, continuous film comprising a plurality of layers wherein a first layer comprises the fusion coating powder composition of claim 1 with an absorptive layer positioned adjacent to the first layer.

17. The film of claim 15 further comprising an absorptive layer proximate to the first layer but on an opposite of the first layer in comparison to the protective layer.

\* \* \* \* \*